United States Patent
Song et al.

(10) Patent No.: US 11,374,368 B2
(45) Date of Patent: Jun. 28, 2022

(54) ABNORMALITY PROMPTING METHOD AND INTELLIGENT SOCKET

(71) Applicant: GREE ELECTRIC APPLIANCES, INC. OF ZHUHAI, Zhuhai (CN)

(72) Inventors: Dechao Song, Zhuhai (CN); Daoyuan Chen, Zhuhai (CN); Lei Peng, Zhuhai (CN)

(73) Assignee: GREE ELECTRIC APPLIANCES, INC. OF ZHUHAI, Zhuhai (CN)

( * ) Notice: Subject to any disclaimer, the term of this patent is extended or adjusted under 35 U.S.C. 154(b) by 35 days.

(21) Appl. No.: 17/044,165

(22) PCT Filed: Dec. 17, 2018

(86) PCT No.: PCT/CN2018/121532
§ 371 (c)(1),
(2) Date: Sep. 30, 2020

(87) PCT Pub. No.: WO2019/192211
PCT Pub. Date: Oct. 10, 2019

(65) Prior Publication Data
US 2021/0036469 A1    Feb. 4, 2021

(30) Foreign Application Priority Data
Apr. 3, 2018 (CN) .......................... 201810298425.3

(51) Int. Cl.
*H01R 13/66*    (2006.01)
*G01R 19/165*    (2006.01)
(Continued)

(52) U.S. Cl.
CPC ... *H01R 13/6691* (2013.01); *G01R 19/16533* (2013.01); *G01R 19/16547* (2013.01);
(Continued)

(58) Field of Classification Search
CPC ................ H01R 13/6691; H01R 13/66; H01R 13/7038; G01R 19/16533; G01R 19/16547; G01R 22/068
See application file for complete search history.

(56) References Cited

U.S. PATENT DOCUMENTS

2005/0157451 A1    7/2005 Kuo
2011/0040785 A1*   2/2011 Steenberg ........... H04L 12/2825
                                                707/769

FOREIGN PATENT DOCUMENTS

CN    202600422 U    12/2012
CN    104135407 A    11/2014
(Continued)

OTHER PUBLICATIONS

International Search Report for corresponding PCT/CN2018/121532 dated Mar. 19, 2019, 2 pages.

*Primary Examiner* — Daniel C Puentes
(74) *Attorney, Agent, or Firm* — Armstrong Teasdale LLP (57) ABSTRACT

An abnormality prompting method and an intelligent socket (30) are provided. Prompting is performed when a home appliance runs abnormally by means of the intelligent socket (30). The method includes: the intelligent socket (30) receives a state message from a first home appliance (S202), and the state message includes indication information used for indicating a current working mode of the first home appliance; the intelligent socket (30) obtains an actual value of a working parameter of the first home appliance (S203); the intelligent socket (30) determines a working state of the first home appliance according to the actual value of the working parameter and a maximum value of the working parameter allowed by the working mode (S204); when determining that the working state of the first home appliance is an abnormal state, the intelligent socket (30) outputs a prompt message (S205).

12 Claims, 2 Drawing Sheets

(51) Int. Cl.
*H01R 13/703* (2006.01)
*G01R 22/06* (2006.01)
H01R 24/78 (2011.01)
G01R 31/28 (2006.01)

(52) U.S. Cl.
CPC ........... *G01R 22/068* (2013.01); *H01R 13/66* (2013.01); *H01R 13/7038* (2013.01); *G01R 31/2836* (2013.01); *H01R 24/78* (2013.01)

(56) References Cited

FOREIGN PATENT DOCUMENTS

| | | |
|---|---|---|
| CN | 104597813 A | 5/2015 |
| CN | 104868326 A | 8/2015 |
| CN | 204740492 U | 11/2015 |
| CN | 105223837 A | 1/2016 |
| CN | 105320044 A | 2/2016 |
| CN | 106385350 A | 2/2017 |
| CN | 106450968 A | 2/2017 |
| CN | 106843001 A | 6/2017 |
| CN | 107197091 A | 9/2017 |
| CN | 206480875 U | 9/2017 |
| CN | 107401807 A | 11/2017 |
| CN | 206697684 U | 12/2017 |
| CN | 107707023 A | 2/2018 |
| CN | 108627689 A | 10/2018 |

* cited by examiner

ABNORMALITY PROMPTING METHOD AND INTELLIGENT SOCKET

CROSS-REFERENCE TO RELATED APPLICATION

The present disclosure is a National Stage entry of International Application No. PCT/CN2018/121532, filed on Dec. 17, 2018, and entitled "Abnormality Prompting Method and Intelligent Socket," which claims priority to Chinese patent application 201810298425.3, filed to the National Intellectual Property Administration, PRC on Apr. 3, 2018 and entitled "Abnormality prompting method and intelligent socket", the contents of which are hereby incorporated by reference in their entirety.

TECHNICAL FIELD

The present disclosure relates to the field of smart home, and in particular to an abnormality prompting method and an intelligent socket.

BACKGROUND

At present, an intelligent socket is mainly used in private home, a user communicates with the intelligent socket by using user equipment (UE) through a wireless communication mode to control the intelligent socket or a home appliance connected with the intelligent socket. For example, the user sets power supply time point or power-off time point of the intelligent socket to the home appliance through the user equipment.

However, there are many limitations to the current intelligent socket, for example, the intelligent socket works according to instructions sent by the user equipment, and performs simple power supply or power-off operations. Therefore, a function of the intelligent socket is relatively single, and user experience is poor.

SUMMARY

In some embodiments, an abnormality prompting method is provided, the method includes:
the intelligent socket receives a state message from a first home appliance, herein the state message includes indication information used for indicating a current working mode of the first home appliance;
the intelligent socket obtains an actual value of a working parameter of the first home appliance;
the intelligent socket determines a working state of the first home appliance according to the actual value of the working parameter and a maximum value of the working parameter allowed by the working mode; and
when determining that the working state of the first home appliance is an abnormal state, the intelligent socket outputs a prompt message.

In some embodiments, an intelligent socket is provided, including:
a receiving element, configured to receive a state message from a first home appliance, and the state message includes indication information used for indicating a current working mode of the first home appliance;
an acquisition element, configured to obtain an actual value of a working parameter of the first home appliance;
a determining element, configured to determine a working state of the first home appliance according to the actual value of the working parameter and a maximum value of the working parameter allowed by the working mode; and
an output element, configured to, when the determining element determines that the working state of the first home appliance is an abnormal state, output a prompt message.

In some embodiments, an intelligent socket is provided, the intelligent socket includes a processor, the processor is configured to execute a computer program stored in a memory to realize the above-mentioned method.

In some embodiments, non-transitory storage medium is provided, the non-transitory storage medium stores computer instructions, when running the computer instructions on a computer, the computer executes the above-mentioned method.

DETAILED DESCRIPTION

In order to make purposes, technical schemes and advantages of embodiments of the present disclosure clearer, the technical schemes in some embodiments of the present disclosure are clearly and completely described below in combination with drawings in some embodiments of the present disclosure.

Technical background of some embodiments of the present disclosure is introduced firstly.

There are many limitations to a current intelligent socket. For example, the intelligent socket works according to at least one instruction sent by user equipment, and performs power supply or power-off operations. Therefore, a function of the current intelligent socket is relatively single, and user experience is poor.

In view of this, some embodiments of the present disclosure provides an abnormality prompting method. In some embodiments, the intelligent socket determines a current working state of a home appliance according to an actual value of a working parameter of the home appliance and a maximum value allowed by a working mode, and when the working state of the home appliance is an abnormal state, a prompt is sent to a user in time, so that the user handles the abnormal state of the home appliance in time, thereby possibility of a potential safety hazard caused by abnormal work of the home appliance is reduced, and using safety of the home appliance is improved. In addition, compared with an intelligent socket known to the inventors, functions of the intelligent socket in some embodiments of the present disclosure are more abundant, thereby the user has the better using experience when the intelligent socket is used.

Figure 1:
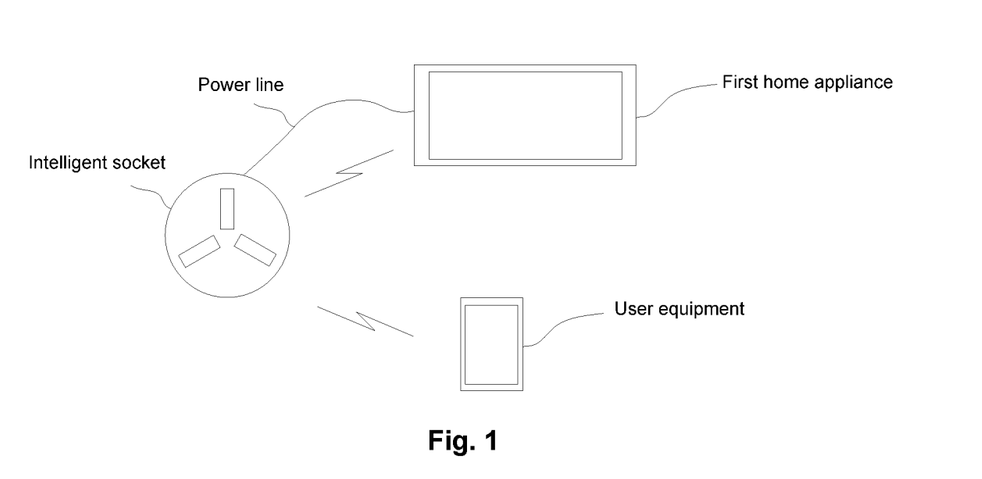
FIG. 1 is an application scene diagram according to some embodiments of the present disclosure.

As shown in FIG. 1, an application scene of some embodiments of the present disclosure is introduced below.

A first home appliance is connected with the intelligent socket through a power line of the first home appliance. That is, a power plug of the first home appliance is inserted in the intelligent socket, and the intelligent socket supplies power to the first home appliance through the power line. The first home appliance is the home appliance which is used in user living. For example, the first home appliance includes, but not limited to, a television, a water heater, a refrigerator or an air conditioner and the like. It is not repeated here.

In some embodiments, the first home appliance bounds with the intelligent socket. After the first home appliance bounds with the intelligent socket, the first home appliance communicates with the intelligent socket through a mode of wireless communication. For example, the mode of wireless communication is Bluetooth communication or Wireless Local Area Networks (WLAN) communication. In addition, the mode of wireless communication further includes other possible modes, and is not limited by some embodiments of the present disclosure.

In some embodiments of the present disclosure, although it is shown in FIG. 1 that the intelligent socket is connected with the first home appliance, it is to be noted that the intelligent socket is further connected with multiple home appliances. The first home appliance is arbitrary one of the multiple home appliances. The abnormality prompting method of the intelligent socket to the multiple home appliances is similar to the abnormality prompting method of the intelligent socket to the first home appliance. Therefore, the following is described by using the first home appliance as an example.

The intelligent socket communicates with the user equipment through the mode of wireless communication. For example, the user equipment includes a mobile phone or a pad and other devices. Although the number of the user equipment is one as shown in FIG. 1, it is to be noted that the intelligent socket further communicates with multiple user equipment.

The technical scheme according to some embodiments of the present disclosure is introduced below in combination with the drawings.

Figure 2:
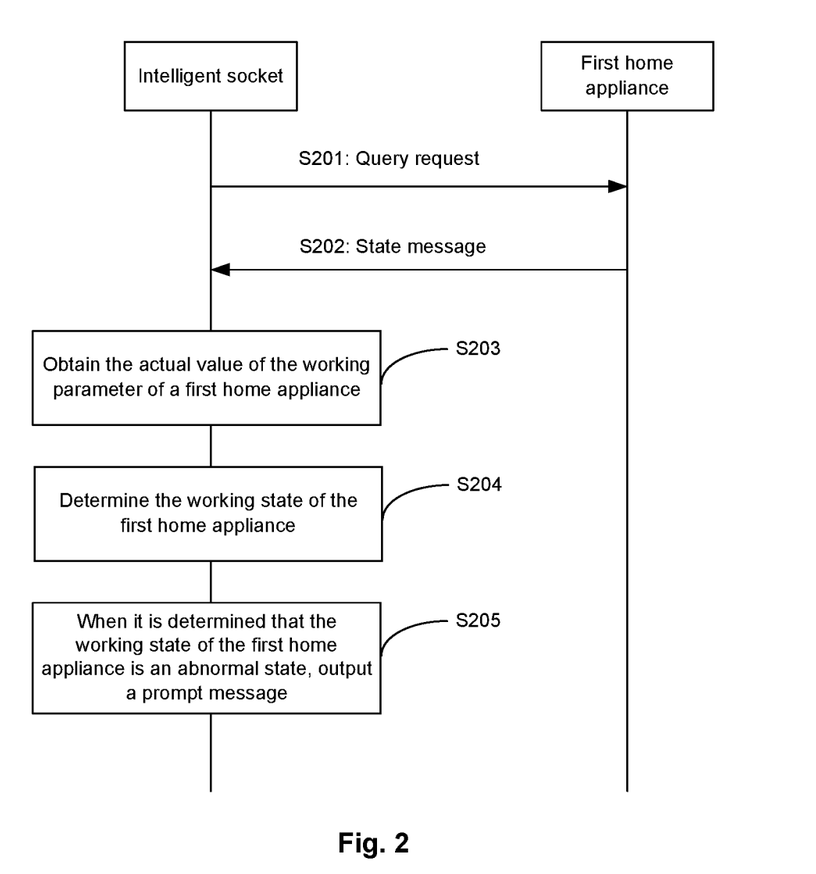
FIG. 2 is a flow schematic diagram of an abnormality prompting method according to some embodiments of the present disclosure.

As shown in FIG. 2, some embodiments of the present disclosure provides an abnormality prompting method, the method is applied to the application scene as shown in FIG. 1, the method is executed by the intelligent socket according to some embodiments of the present disclosure, and a flow of the method is described as follows.

At step S201: the intelligent socket sends a query request to the first home appliance, and the first home appliance receives the query request.

In some embodiments of the present disclosure, in order to send the prompt to the user when the first home appliance works abnormally, the intelligent socket firstly needs to know the working state of the first home appliance. The working state represents whether current work of the first home appliance is normal. For example, the working state includes normal state and abnormal state. When the working state of the first home appliance is the normal state, the value of the working parameter of the first home appliance is within an allowable range. Correspondingly, when the working state of the first home appliance is the abnormal state, the value of the working parameter of the first home appliance is not within the allowable range.

In order to determine the working state of the first home appliance, the intelligent socket needs to know the current working mode of the first home appliance. The intelligent socket sends the query request to the first home appliance, so as to inquire the current working mode of the first home appliance.

Specifically, the maximum value of the working parameter of the first home appliance allowed by each working mode is per-stored in the intelligent socket. Thus, the intelligent socket needs to know the current working mode of the first home appliance to correspondingly find the maximum value of the working parameter allowed by the working mode. For example, the working parameter is at least one of a current, a voltage and a power, and the maximum value of the working parameter is at least one of a current limit value, a voltage limit value and a power limit value of the first home appliance in the working mode.

Specifically, based on the consideration of miniaturization of the intelligent socket, and in order to save storage space of the intelligent socket, the maximum value of the working parameter of the first home appliance allowed by each working mode may be stored in a server, after the intelligent socket determines the current working mode of the first home appliance, information of the working mode is sent to the server, and then the server feeds back the maximum value of the working parameter allowed by the working mode to the intelligent socket.

Specifically, the query request sent by the intelligent socket not only requests the first home appliance to inform the current working mode, but also requests the first home appliance to send the maximum value of the working parameter allowed by the working mode to the intelligent socket. Or, the intelligent socket directly requests to obtain the maximum value of the working parameter of the first home appliance allowed by the current working mode of the first home appliance.

When the intelligent socket sends the query request to the first home appliance, the query request is sent by using a wireless communication protocol pre-agreed with the first home appliance. Specifically, a data packet using the communication protocol may include the following content.

(1) Header code: the header code is represented by two bytes, for example, the header code is 0×6D 0×6D.

(2) Frame length: the frame length is used for representing a length of data included in the whole data packet.

(3) Command word: the command word is used for representing a type of the obtained data. For example, the command word 0×01 represents that the requested obtained data is running data or data carried in the data packet is the running data, and the command word 0×02 represents that the requested obtained data is timing data or the data carried in the data packet is the timing data.

(4) Valid information: the valid information is a valid byte carried in the data packet.

(5) Check bit: the check bit is used for performing sum check operation from a first byte after the frame header to a byte before check.

At step S202: the first home appliance sends a state message to the intelligent socket, and the intelligent socket receives the state message.

In some embodiments of the present disclosure, after receiving the query request, the first home appliance feeds back the state message to the intelligent socket according to the query request. For example, the query request requests the first home appliance to send the current working mode of the first home appliance to the intelligent socket, and then the first home appliance carries the indication information for indicating the current working mode of the first home appliance in the state message. Or, the query request is used for requesting the first home appliance to send the working mode of the first home appliance and the maximum value of the working parameter allowed by the working mode to the intelligent socket together, and then the first home appliance carries the indication information, and the maximum value of the working parameter allowed by the working mode in the state message. Or, the query request is used for requesting the first home appliance to send the maximum value of the working parameter allowed by the current working mode of the first home appliance to the intelligent socket, and then the first home appliance carries the maximum value of the working parameter allowed by the current working mode of the first home appliance in the state message.

In some embodiments of the present disclosure, the first home appliance also carries other information in the state message. For example, when the intelligent socket is connected with multiple home appliances, in order that the intelligent socket identifies that the state message indicated is information of which appliance, the state message also carries a type of the first home appliance. Or, when a failure happens to the first home appliance, the first home appliance also carries a failure code in the state message.

Specifically, as shown in Table 1, information possibly carried in the state message is listed in Table 1.

TABLE 1

| Field | Meaning |
| --- | --- |
| Home appliance type | Used for indicating the type of the first home appliance |
| Working mode | Used for indicating the working mode of the first home appliance |
| Current limit value | Used for representing the maximum value of the current allowed by the current working mode |
| Voltage current value | Used for representing the maximum value of the voltage allowed by the current working mode |
| Failure code | Used for indicating the failure code when the failure happens to the first home appliance |

The home appliance type field is used for indicating the type of the first home appliance. For example, the type of the first home appliance is an air conditioner, an electric cooker or a dehumidifier and the like. The different types of the home appliances are represented by different numbers or letters. For example, as shown in Table 1, when the field is 1, it is represented that the first home appliance is the air conditioner, when the field is 2, it is represented that the first home appliance is the electric cooker, and when the field is 3, it is represented that the first home appliance is the dehumidifier.

The working mode field is the indication information for indicating the current working mode of the first home appliance. Similarly, the different working modes are also represented by the different numbers or letters. For example, as shown in Table 1, when the first home appliance is the air conditioner, it may be represented that the working mode is a refrigeration mode when the field is 1, it may be represented that the working mode is a heating mode when the field is 2, and it may be represented that the working mode is an air distribution mode when the field is 3.

The current limit value field is used for representing the maximum value of the current allowed by the current working mode. One way of representing is to represent a current value by one number, and the current limit value is determined according to a size of the received number. For example, the current limit value is represented by numbers 1 to 255, the number 1 represents 0 ampere (A), and each additional 1 represents that the current increases 0.1 A, in other words, the number 2 represents 0.1 A, the number 3 represents 0.2 A, and so on. Certainly, the current limit value is also represented by other possible representing ways, and some embodiments of the present disclosure do not limit this.

The voltage limit value field is used for representing the maximum value of the voltage allowed by the current working mode. One way of representing is to represent a voltage value by one number, and the voltage limit value is determined according to a size of the received number. For example, the voltage limit value is represented by numbers 1 to 550, the number 275 represents 0 voltage (V), and each additional 1 represents that the voltage increases 1 V, in other words, the number 276 represents 1 V, the number 277 represents 2 A, and minus 1 represents that the voltage decreases 1 V, in other words, the number 274 represents −1 V, the number 273 represents −2V, and so on. Certainly, the voltage limit value is also represented by other possible representing ways, and some embodiments of the present disclosure do not limit this.

The failure code field represents the failure code when the failure happens to the first home appliance. For example, H6 represents a motor failure of the first home appliance, and F2 represents a temperature sensing bulb failure of the first home appliance.

At step S203: the intelligent socket obtains the actual value of the working parameter of the first home appliance.

The intelligent socket obtains the actual value of the working parameter through the power plug. The working parameter includes the current and the voltage, the actual value of the current also includes a current peak value and a current valid value, and the actual value of the voltage also includes a voltage peak value and a voltage valid value.

Specifically, the intelligent socket is provided with a current collecting module and a voltage collecting module, the current collecting module and the voltage collecting module obtains the actual values of the above current and voltage through collecting the current and the voltage on the power line.

As shown in Table 2, the actual value of the working parameter of the first home application to be obtained is listed in Table 2.

TABLE 2

| Working parameter | Meaning |
| --- | --- |
| Voltage peak value | The voltage peak value when the first home appliance runs in real time |
| Voltage valid value | The voltage valid value when the first home appliance runs in real time |
| Current peak value | The current peak value when the first home appliance runs in real time |
| Current valid value | The current valid value when the first home appliance runs in real time |
| Real-time power | The real-time power of the first home appliance obtained by calculating the obtained voltage and current values |

The working parameter further includes the real-time power when the first home appliance runs. The real-time power is obtained by calculating the current and the voltage obtained by checking.

In some embodiments of the present disclosure, a process that the intelligent socket obtains the working mode of the first home appliance, namely a process that the intelligent socket obtains the actual value of the working parameter of the first home appliance in the step S201 and the step S202, and namely the step S203, does not have a sequential order substantially. In other words, in some embodiments, the two processes are performed sequentially. For example, the process that the intelligent socket obtains the working mode of the first home appliance is firstly performed, and then the process that intelligent socket obtains the actual value of the working parameter of the first home appliance is performed. Or the process that intelligent socket obtains the actual value of the working parameter of the first home appliance is firstly performed, and then the process that the intelligent socket obtains the working mode of the first home appliance is performed. In some embodiments, the two processes are also performed simultaneously.

At step S204: the intelligent socket determines the working state of the first home appliance.

After the actual value of the working parameter and the maximum value of the working parameter allowed by the working mode are obtained, the intelligent socket determines the working state of the first home appliance according to the actual value of the working parameter and the maximum value of the working parameter allowed by the working mode.

Specifically, the intelligent socket compares the actual value of the working parameter with the maximum value of the working parameter allowed by the working mode, thereby determining whether the actual value of the working parameter is greater than the maximum value of the working parameter allowed by the working mode. When the intelligent socket determines that the actual value of the working parameter is greater than the maximum value of the working parameter allowed by the working mode, the intelligent socket determines that the current working state of the first home appliance is the abnormal state.

Specifically, due to the limitation of space and computing power of the intelligent socket, the intelligent socket also sends the actual value of the working parameter and the information for indicating the working mode to the server, or send the actual value of the working parameter and the maximum value of the working parameter allowed by the working mode to the server together. I In order that the server correctly identities that a numerical value sent by the intelligent socket corresponds to which the working parameter respectively, the intelligent socket also organizes the actual value of the working parameter as a fixed format, and send to the server. For example, the intelligent socket pre-agrees a format of a data table with the server, and the intelligent socket performs organization in the pre-agreed format.

When the intelligent socket sends the actual value of the working parameter and the information for indicating the working mode to the server, the server finds the maximum value of the working parameter allowed by the working mode in the server according to the working mode, and compares the actual value of the working parameter with the maximum value of the working parameter allowed by the working mode, thereby determining the working state of the first home appliance, carrying the determined working state in feedback message, and sending the feedback message to the intelligent socket, so that the intelligent socket determines the working state of the first home appliance according to the feedback message. Certainly, in order to reduce a number of interactions between the server and the intelligent socket, the server also sends feedback information for indicating that the first home appliance is in the abnormal state to the intelligent socket when the working state of the first home appliance is the abnormal state, and then the intelligent socket directly determines that the first home appliance runs abnormally according to the feedback information.

When the intelligent socket sends the actual value of the working parameter and the maximum value of the working parameter allowed by the working mode to the server together, the server directly determines the working state of the first home appliance according to the actual value of the working parameter and the maximum value of the working parameter allowed by the working mode.

At step S205: when determining that the working state of the first home appliance is the abnormal state, the intelligent socket outputs a prompt message.

In some embodiments of the present disclosure, after the working state of the first home appliance is determined, the intelligent socket performs corresponding operation according to the determined working state. When the working state of the first home appliance is the normal state, the intelligent socket does not need to perform reminding. And when the working state of the first home appliance is the abnormal state, the intelligent socket outputs the prompt message, so as to remind the user that the current work of the first home appliance is abnormal, so that the user eliminates work abnormality in time, and a safety accident is prevented from damaging the first home appliance.

Specifically, in a running process of the home appliance, a situation that the actual value of the working parameter is not too greater than the maximum value happens, namely the difference value between the actual value of the working parameter and the maximum value allowed is within the allowable range, and in the range, the home appliance tolerates such abnormal operation without generating excessive loss to the home appliance, thus when the difference value between the actual value of the working parameter of the first home appliance and the maximum value allowed is within the allowable range, for example, when the difference value between the voltage, the current or the power and the allowed maximum value corresponding to the working mode is not greater than a preset difference threshold value, or when specific values of the difference value and the maximum value are not greater than a first preset proportion threshold value, the intelligent socket does not perform any processing. In some embodiments, the first preset proportion threshold value is 20%, certainly, the first preset proportion threshold value is also set to be other possible values, and some embodiments of the present disclosure does not limit this.

Specifically, when the difference value between the actual value of the working parameter of the first home appliance and the maximum value allowed is too large, and when the first home appliance continues to run, the larger safety accident is caused, or the first home appliance is greatly damaged. In this case, the intelligent socket directly stops working on the first home appliance, namely a power source of the home appliance is cut off, so that the first home appliance no longer works. At the same time, the intelligent socket also outputs the prompt message, so that the user knows in time that the first home appliance works abnormally.

The difference value between the actual value of the working parameter of the first home appliance and the maximum value allowed is too large, for example, when the difference value between the actual value of the working parameter of the first home appliance and the maximum value allowed is greater than the first present threshold value, and the first present threshold value is greater than the above preset difference threshold value; or the specific value of the difference value and the maximum value is greater than a second preset proportion threshold value, and the second preset proportion threshold value is greater than the above first preset proportion threshold value. In some embodiments, the second preset proportion threshold value is 40%, certainly, the second preset proportion threshold value is also set to be other possible values, and is not limited by some embodiments of the present disclosure.

Specifically, when the difference value between the actual value of the working parameter of the first home appliance and the maximum value allowed is between the above first preset threshold value and preset difference threshold value, or when the specific value of the difference value and the maximum value is between the first preset proportion threshold value and the second preset proportion threshold value, in order to guarantee normal using of the first home appliance, the intelligent socket keeps power supply to the first home appliance, and outputs the prompt message.

In some embodiments of the present disclosure, a mode in which the intelligent socket outputs the prompt message includes at least one of the following modes.

(1) The intelligent socket sends the prompt message to the designated user equipment. The user installs a corresponding Application (APP) in the user equipment, so the intelligent socket sends the prompt message to the APP in the user equipment, so as to remind the user that the first home appliance works abnormally.

(2) The intelligent socket sends the prompt message to an alarm. The alarm is an alarm included in the intelligent socket, or is an alarm installed in other positions outside the intelligent socket. The prompt message sent to the alarm by the intelligent socket is used for indicating the alarm to output an alarm signal. For example, the alarm signal is an audible alarm signal and an optical alarm signal, or an audible alarm signal, or an optical alarm signal.

In some embodiments of the present disclosure, after the user knows the abnormal work of the first home appliance and eliminates the abnormality, the user operates a reset button on the intelligent socket, or the user also operates a service button on the APP, so as to make the intelligent socket work again, namely the power is supplied to the first home appliance and the alarm is released.

In some embodiments of the present disclosure, the intelligent socket periodically determines the working state of the first home appliance, so as to continuously guarantee the safe using of the first home appliance.

In conclusion, in some embodiments of the present disclosure, the intelligent socket determines the current working state of the home appliance according to the actual value of the working parameter of the home appliance and the maximum value allowed by the working mode, and then when the working state of the home appliance is the abnormal state, the prompting is sent to the user in time, so that the user handles the abnormal state of the home appliance in time, thereby the possibility of the potential safety hazard caused by the abnormal work of the home appliance is reduced, and the using safety of the home appliance is improved. In addition, compared with an intelligent socket in an existing technology, functions of the intelligent socket in some embodiments of the present disclosure are more abundant, thereby the user has the better using experience when the intelligent socket is used.

Figure 3:
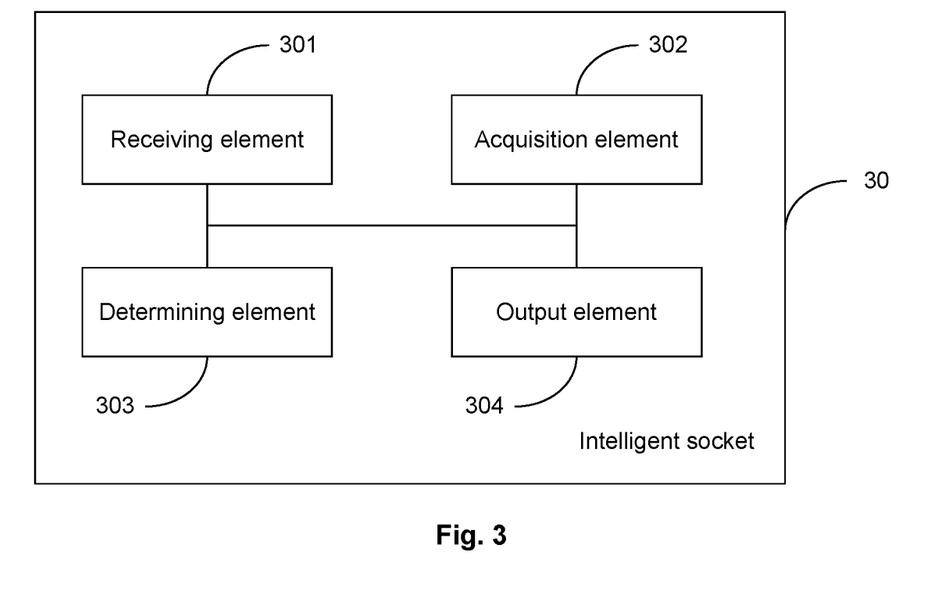
FIG. 3 is a structural schematic diagram of an intelligent socket according to some embodiments of the present disclosure.

As shown in FIG. 3, based on the same inventive concept, some embodiments of the present disclosure provides an intelligent socket 30, including:

a receiving element 301, configured to receive a state message from a first home appliance, herein the state message includes indication information used for indicating a current working mode of the first home appliance;

an acquisition element 302, configured to obtain an actual value of a working parameter of the first home appliance;

a determining element 303, configured to determine a working state of the first home appliance according to the actual value of the working parameter and a maximum value of the working parameter allowed by the working mode; and an output element 304, configured to, when the determining element determines that the working state of the first home appliance is an abnormal state, output a prompt message.

Optionally, the determining element 303 is configured to:

send a verification request to a server, the verification request includes the actual value of the working parameter and the indication information, and the verification request is configured to request the server to determine the working state of the first home appliance;

receive feedback information from the server; and determine the working state of the first home appliance according to the feedback information.

Optionally, the determining element 303 is configured to:

determine whether the actual value of the working parameter is greater than or equal to the maximum value of the working parameter allowed by the working mode; and when determining that the actual value of the working parameter is greater than or equal to the maximum value of the working parameter allowed by the working mode, determine that the working state of the first home appliance is the abnormal state.

Optionally, the determining element 303 is further configured to:

determine whether a difference value between the actual value of the working parameter and the maximum value of the working parameter allowed by the working mode is greater than or equal to a first preset threshold value; and when determining that the difference value between the actual value of the working parameter and the maximum value of the working parameter allowed by the working mode is greater than or equal to the first preset threshold value, stop supplying power to the first home appliance.

Optionally, a power plug of the first home appliance is connected with the intelligent socket, so the acquisition element 302 is configured to:

obtain an actual value of a current and an actual value of a voltage of the first home appliance through the power plug.

Optionally, the output element 304 is configured to:

send the prompt message to designated user equipment and send the prompt message to an alarm, the prompt message being used for indicating the alarm to output an alarm signal; or, send the prompt message to designated user equipment; or, send the prompt message to an alarm, the prompt message being used for indicating the alarm to output an alarm signal.

The device is configured to execute the method according to some embodiments as shown in FIG. 2, therefore, functions and the like which is achieved by each functional module of the device refers to the description of some embodiments as shown in FIG. 2, and are not repeatedly described.

Figure 4:
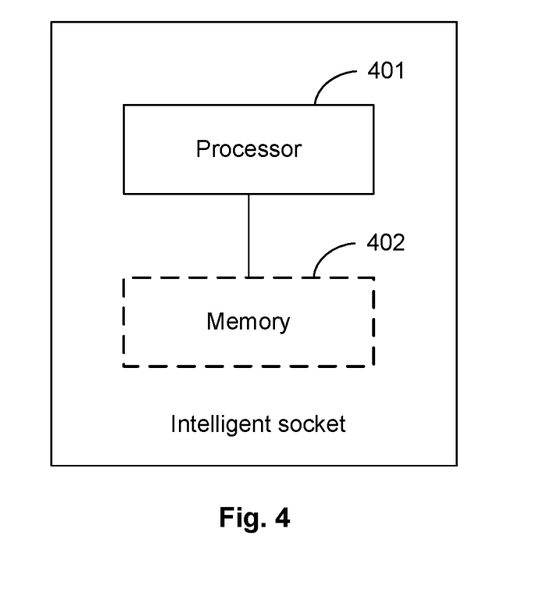
FIG. 4 is another structural schematic diagram of the intelligent socket according to some embodiments of the present disclosure.

As shown in FIG. 4, based on the same inventive concept, some embodiments of the present disclosure provides an intelligent socket, the intelligent socket includes at least one processor 401, the at least one processor 401 is configured to execute a computer program stored in a memory to realize the steps of the abnormality prompting method according to some embodiments as shown in FIG. 2.

Optionally, the at least one processor 401 specifically includes a central processing element (CPU), and an application specific integrated circuit (ASIC), is at least one integrated circuit configured to execute a control program, is a hardware circuit developed by using a field programmable gate array (FPGA), and is a digital base band processor.

Optionally, the at least one processor 401 includes at least one processing core.

Optionally, the intelligent socket further includes a memory 402, the memory 402 includes a read only memory (ROM), a random access memory (RAM) and a magnetic disk memory. The memory 402 is configured to store data required when the at least one processor 401 runs. There is at least one memory 402. The at least one memory 402 is shown together in FIG. 4, but it is to be noted that the memory 402 is not a necessary functional component, thus the at least one memory is shown in FIG. 4 by a dotted line.

Based on the same inventive concept, some embodiments of the present disclosure provides a non-transitory storage medium, the non-transitory storage medium stores a computer instruction, when the computer instruction is executed on a computer, the computer executes the steps of the abnormality prompting method according to some embodiments as shown in FIG. 2.

In a specific implementation process, the non-transitory storage medium includes: a universal serial bus flash drive (USB), a mobile hard disk drive, a read-only memory (ROM), a random access memory (RAM), a magnetic disk or an optical disk and various storage mediums capable of storing program codes.

In some embodiments of the present disclosure, it should be understood that the disclosed devices and methods are achieved in other ways. For example, some embodiments of the devices described above are schematic, for example, the element or the division of the element is a logical function division, and there are other division modes in actual implementation, for example, multiple elements or components are combined or integrated into another system, or some features are ignored, or not executed. In addition, the displayed or discussed mutual coupling or direct coupling or communication connection is indirect coupling or communication connection through some interfaces, devices or elements, and is electrical or other forms.

Each functional element in some embodiments of the present disclosure is integrated in one processing element, or each element is also an independent physical component.

When the integrated element is achieved in the form of a software functional element and sold or used as an independent product, the integrated element is stored in a non-transitory storage medium. Based on such understanding, all or part of the technical schemes of some embodiments of the present disclosure is embodied in the form of a software product. The computer software product is stored in a storage medium, and includes several instructions which are used for enabling a computer device, such as a personal computer, a server, a network device, or a processor, to execute all or part of the steps of the method in each embodiment of the present disclosure. The above storage medium includes: a universal serial bus flash drive (USB), a mobile hard disk drive, a read-only memory (ROM), a random access memory (RAM), a magnetic disk or an optical disk and various mediums capable of storing program codes.

In conclusion, the above embodiments are used for introducing the technical schemes of the present disclosure in detail, but the description of the above embodiments are used for helping understand the methods of some embodiments of the present disclosure, and should not be understood as the limitation to some embodiments of the present disclosure. Changes or replacements which are easily imagined by those skilled in the art shall fall within a scope of protection of some embodiments of the present disclosure.

What is claimed is:

1. An abnormality prompting method, comprising:
an intelligent socket receiving a state message from a first home appliance, wherein the state message comprises indication information for indicating a current working mode of the first home appliance;
the intelligent socket obtaining an actual value of a working parameter of the first home appliance;
the intelligent socket determining a working state of the first home appliance according to the actual value of the working parameter and a maximum value of the working parameter allowed by the working mode; and
when determining that the working state of the first home appliance is an abnormal state, the intelligent socket outputting a prompt message;
wherein after the intelligent socket determining that the working state of the first home appliance is the abnormal state, the method further comprises:
the intelligent socket determining whether a difference value between the actual value of the working parameter and the maximum value of the working parameter allowed by the working mode is greater than or equal to a first preset threshold value; when determining that the difference value between the actual value of the working parameter and the maximum value of the working parameter allowed by the working mode is greater than or equal to the first preset threshold value, the intelligent socket stopping supplying power to the first home appliance; and
when determining that the difference value between the actual value of the working parameter and the maximum value of the working parameter allowed by the working mode is smaller than the first preset threshold value, the intelligent socket performing none processing.

2. The method as claimed in claim 1, wherein the intelligent socket determining the working state of the first home appliance according to the actual value of the working parameter and the maximum value of the working parameter allowed by the working mode comprising:
the intelligent socket sending a verification request to a server, the verification request comprising the actual value of the working parameter and the indication information, and the verification request being used for requesting the server to determine the working state of the first home appliance;
the intelligent socket receiving feedback information from the server; and
the intelligent socket determining the working state of the first home appliance according to the feedback information.

3. The method as claimed in claim 1, wherein the intelligent socket determining the working state of the first home appliance according to the actual value of the working parameter and the maximum value of the working parameter allowed by the working mode comprising:
the intelligent socket determining whether the actual value of the working parameter is greater than or equal to the maximum value of the working parameter allowed by the working mode; and
when determining that the actual value of the working parameter is greater than or equal to the maximum value of the working parameter allowed by the working mode, the intelligent socket determining that the working state of the first home appliance is the abnormal state.

4. The method as claimed in claim 1, wherein a power plug of the first home appliance is connected with the intelligent socket, the intelligent socket obtaining the actual value of the working parameter of the first home appliance, comprising:

the intelligent socket obtaining an actual value of a current and an actual value of a voltage of the first home appliance through the power plug.

5. The method as claimed in claim 1, wherein the intelligent socket outputting the prompt message comprising:

the intelligent socket sending the prompt message to designated user equipment and the intelligent socket sending the prompt message to an alarm, the prompt message being used for indicating the alarm to output an alarm signal; or, the intelligent socket sending the prompt message to designated user equipment; or, the intelligent socket sending the prompt message to an alarm, the prompt message being used for indicating the alarm to output an alarm signal.

6. A non-transitory storage medium, wherein the non-transitory storage medium stores computer instructions, when running the computer instructions on a computer, the computer executes the method as claimed in claim 1.

7. An intelligent socket, comprising:

a receiving element, configured to receive a state message from a first home appliance, wherein the state message comprises indication information used for indicating a current working mode of the first home appliance;

an acquisition element, configured to obtain an actual value of a working parameter of the first home appliance;

a determining element, configured to determine a working state of the first home appliance according to the actual value of the working parameter and a maximum value of the working parameter allowed by the working mode; and an output element, configured to, when the determining element determines that the working state of the first home appliance is an abnormal state, output a prompt message;

wherein the determining element is further configured to:
determine whether a difference value between the actual value of the working parameter and the maximum value of the working parameter allowed by the working mode is greater than or equal to a first preset threshold value;

when determining that the difference value between the actual value of the working parameter and the maximum value of the working parameter allowed by the working mode is greater than or equal to the first preset threshold value, stop supplying power to the first home appliance; and when determining that the difference value between the actual value of the working parameter and the maximum value of the working parameter allowed by the working mode is smaller than the first preset threshold value, does not perform any processing.

8. The intelligent socket as claimed in claim 7, wherein the determining element is configured to:

send a verification request to a server, the verification request comprising the actual value of the working parameter and the indication information, and the verification request being used for requesting the server to determine the working state of the first home appliance;

receive feedback information from the server; and
determine the working state of the first home appliance according to the feedback information.

9. The intelligent socket as claimed in claim 7, wherein the determining element is configured to:

determine whether the actual value of the working parameter is greater than or equal to the maximum value of the working parameter allowed by the working mode; and when determining that the actual value of the working parameter is greater than or equal to the maximum value of the working parameter allowed by the working mode, determine that the working state of the first home appliance is the abnormal state.

10. The intelligent socket as claimed in claim 7, wherein a power plug of the first home appliance is connected with the intelligent socket, so the acquisition element is configured to:

obtain an actual value of a current and an actual value of a voltage of the first home appliance through the power plug.

11. The intelligent socket as claimed in claim 7, wherein the output element is configured to:

send the prompt message to designated user equipment and send the prompt message to an alarm, the prompt message being used for indicating the alarm to output an alarm signal; or, send the prompt message to designated user equipment; or, send the prompt message to an alarm, the prompt message being used for indicating the alarm to output an alarm signal.

12. An intelligent socket, comprising a processor, the processor being configured to execute a computer program stored in a memory to realize a method comprising the following steps:

receiving a state message from a first home appliance, wherein the state message comprises indication information for indicating a current working mode of the first home appliance;

obtaining an actual value of a working parameter of the first home appliance;

determining a working state of the first home appliance according to the actual value of the working parameter and a maximum value of the working parameter allowed by the working mode; and when determining that the working state of the first home appliance is an abnormal state, outputting a prompt message;

wherein after determining that the working state of the first home appliance is the abnormal state, the method further comprises:

determining whether a difference value between the actual value of the working parameter and the maximum value of the working parameter allowed by the working mode is greater than or equal to a first preset threshold value; when determining that the difference value between the actual value of the working parameter and the maximum value of the working parameter allowed by the working mode is greater than or equal to the first preset threshold value, stopping supplying power to the first home appliance; and when determining that the difference value between the actual value of the working parameter and the maximum value of the working parameter allowed by the working mode is smaller than the first preset threshold value, performing none processing.

* * * * *